United States Patent
Quint et al.

(10) Patent No.: US 9,090,987 B2
(45) Date of Patent: Jul. 28, 2015

(54) HIGHLY ORDERED ARRAYS OF COLLOIDAL 2D CRYSTALS AND METHODS FOR PRODUCING THE SAME

(75) Inventors: Stefan B. Quint, Stuttgart (DE); Claudia Pacholski, Stuttgart (DE)

(73) Assignee: Max-Planck-Gesellschaft zur Foerderung der Wissenschaften e. V., Munich (DE)

( * ) Notice: Subject to any disclaimer, the term of this patent is extended or adjusted under 35 U.S.C. 154(b) by 0 days.

(21) Appl. No.: 14/003,005

(22) PCT Filed: Mar. 4, 2011

(86) PCT No.: PCT/EP2011/001081
§ 371 (c)(1),
(2), (4) Date: Sep. 4, 2013

(87) PCT Pub. No.: WO2012/119609
PCT Pub. Date: Sep. 13, 2012

(65) Prior Publication Data
US 2013/0338303 A1    Dec. 19, 2013

(51) Int. Cl.
*C30B 7/02* (2006.01)
*B81C 1/00* (2006.01)
(Continued)

(52) U.S. Cl.
CPC ... *C30B 7/02* (2013.01); *B05D 1/18* (2013.01); *B81C 1/00031* (2013.01); *B82Y 40/00* (2013.01);
(Continued)

(58) Field of Classification Search
CPC .............. B81C 1/00031; B05D 1/005; B05D 2401/32; B82Y 30/00; B82Y 40/00; C30B 29/58; C30B 7/02; H01L 21/0271; H01L 21/0337; H01L 21/31144; C03C 17/007; C23C 18/1605; Y10S 977/779; Y10S 977/883
See application file for complete search history.

(56) References Cited

U.S. PATENT DOCUMENTS

| | | | |
|---|---|---|---|
| 6,372,405 B1 * | 4/2002 | Wells et al. | 430/270.1 |
| 2008/0053951 A1 * | 3/2008 | Jia et al. | 216/12 |

FOREIGN PATENT DOCUMENTS

WO    2010099805 A1    9/2010

OTHER PUBLICATIONS

S. Tsuji and H. Kawaguchi, "Self-assembly of Poly(N-isopropylacrylamide)—Carrying Microspheres into Two-Dimensional Colloidal Arrays", Langmuir, vol. 21, year 2005, pp. 2434-2437.*

(Continued)

*Primary Examiner* — Lan Vinh
*Assistant Examiner* — Jiong-Ping Lu
(74) *Attorney, Agent, or Firm* — Caesar Rivise, PC (57) ABSTRACT

The present invention relates to highly ordered arrays of colloidal 2D crystals on a substrate and to an improved method for producing the same. The method according to the invention for producing an highly ordered array of colloidal 2D crystals on a substrate comprises the following steps: a) providing a suspension of microspheres comprising poly-N-isopropylamide (polyNIPAM), the microspheres being selected from pure poly-N-isopropylamide (polyNIPAM) hydrogel microspheres, functionalized polyNIPAM microspheres, and polymeric or inorganic beads carrying poly-N-isopropyl-amide (polyNIPAM) hydrogel chains, in an aqueous medium on a substrate, wherein the aqueous medium comprises a mixture of water and a lower alkyl alcohol, b) subjecting the suspension deposited on the substrate after step a) to a shear force, and c) drying the suspension. In a preferred embodiment of the invention, the shear force is generated by applying a pulsed gas stream to the substrate surface. The colloidal 2D crystal arrays obtained by this method have an exceptional high long range order, including monocrystalline domains in the range of square millimeters.

15 Claims, 6 Drawing Sheets

(51) Int. Cl.
*B82Y 40/00* (2011.01)
*H01L 21/027* (2006.01)
*H01L 21/033* (2006.01)
*H01L 21/311* (2006.01)
*C03C 17/00* (2006.01)
*C23C 18/16* (2006.01)
*B05D 1/18* (2006.01)
*C30B 29/58* (2006.01)
*B05D 1/00* (2006.01)
*B05D 3/12* (2006.01)

(52) U.S. Cl.
CPC ............ *C03C 17/007* (2013.01); *C23C 18/1605* (2013.01); *C30B 29/58* (2013.01); *H01L 21/0271* (2013.01); *H01L 21/0337* (2013.01); *H01L 21/31144* (2013.01); *B05D 1/00* (2013.01); *B05D 1/005* (2013.01); *B05D 3/12* (2013.01)

(56) References Cited

OTHER PUBLICATIONS

J.C. Hulteen and R.P. Van Duyne, Nanosphere Lithography: A Materials Genberal Fabrication Process for Periodic Particle Array Surfaces, J. Vac. Sci. Tech. A, vol. 13(3), year 1995, pp. 1553-1558.*

P. Colson et al., "Experimental Design Applied to Spin Coating of 2D Colloidal Crystal Masks", Langmuir, vol. 27, year 2011, pp. 12800-12806.*

P. Jiang et al., "Two-Dimensional Non-close-packed Colloidal Crystals Formed by Spincoating", Applied Physics Letter, vol. 89, year 2006, pp. 011908-1 to 011908-3.*

Jiang et al., "Two-dimensional nonclose-packed colloidal crystals formed by spincoating", Applied Physics Letters, vol. 89, pp. 011908-1-3 (2006).

Li et al., "Modulating Two-Dimensional Non-Close-Packed Colloidal Crystal Arrays by Deformable Soft Lithography", Langmuir, vol. 26, No. 4, pp. 2930-2936 (2010).

Pelton et al., "Preparation of Aqueous Latices with N-Isopropylacrylamide", Colloids and Surfaces, vol. 20, pp. 247-256 (1986).

Reculusa et al., "Langmuir-Blodgett films of micron-sized organic and inorganic colloids", Phys. Chem. Chem. Phys., vol. 9, pp. 6385-6390 (2007).

Iyer et al., "Self-Healing Colloidal Crystals", Angew. Chem. Int. Ed, vol. 48, pp. 4562-4566 (2009).

Tsuji et al., "Self-Assembly of Poly(N-isopropylacrylamide)—Carrying Microspheres into Two-Dimensional Colloidal Arrays", Langmuir, vol. 21, pp. 2434-2437 (2005).

Wei et al., "Grain boundary dynamics under mechanical annealing in two-dimensional colloids", Physical Review E., vol. 70, pp. 020401-1-4 (2004).

Zhang et al., "Two-Dimensional Non-Close-Packing Arrays Derived from Self-Assembly of Biomineralized Hydrogel Spheres and Their Patterning Applications", Chem. Mater., vol. 17, pp. 5268-5274 (2005).

International Search Report for PCT/EP2011/001081 dated Nov. 25, 2011.

* cited by examiner

HIGHLY ORDERED ARRAYS OF COLLOIDAL 2D CRYSTALS AND METHODS FOR PRODUCING THE SAME

BACKGROUND

Two-dimensional crystals of colloids are widely used as templates for the structuring of surfaces. Among others, they may serve as lithographic masks for etching or sputtering processes, as patterned arrays of relief structures to cast elastomeric stamps for use in soft lithographic techniques, as photonic crystals and microlenses.

Especially lithography benefits from the use of colloidal crystals as their production is usually simple, cost effective, allows high throughput and supersedes the use of complex equipment, thus having great advantages over conventional lithographic approaches.

A vast of techniques has been developed to produce 2D colloidal crystals. However, only a relatively small number of techniques is focused on the fabrication of non-close packed colloidal crystals (Jiang, P., et al., *Appl. Phys. Lett.* 89, 011908-3 (2006); Zhang, G., et al., *Chemistry of Materials* 17, 5268-5274 (2005); Li, X., et al., *Langmuir* 26, 2930-2936 (2010)). The developed techniques provide only low throughput, apply only to small scale surfaces or involve at least a post-treatment of the colloidal crystal such as reactive ion etching. Consequently, these techniques of the art undermine to some extend the aforementioned advantages of colloidal crystals.

It is principally known in the prior art that self-assembling poly-N-isopropylamide (polyNIPAM) microspheres can be used to produce two-dimensional colloidal arrays, with the superlattice structure of these colloids being controllable by designing the particle structure (Tsuji and Kawaguchi, Langmuir 2005, 21, 2434-2437). Tsuji and Kawaguchi prepared the colloidal arrays by dropping an aqueous PNIPAM microgel dispersion onto various substrates and air-drying. Experiments of the present inventors revealed that these conditions resulted in an uneven distribution of the deposited microgel particles and both the near-range and the long-range order of the colloidal arrays obtained by this method was not satisfying. The uneven distribution of the deposited microgel particles is based on the increasing concentration of particles in the dispersion upon drying. Therefore the two-dimensional array shows a lot of defects.

WO 2010/099805 A1 discloses a method for preparing highly ordered arrays of nanoholes in metallic films wherein an ordered array of polyNIPAM microspheres is deposited on a substrate surface and subsequently used as a mask for the nanohole array. Said arrays of polyNIPAM microspheres show a considerably higher degree of order as compared to arrays known from previous prior art, however, it is still not possible to obtain 2D crystal arrays with an exceptional high long range order, including monocrystalline domains in the range of square millimeters, by this method.

Thus, an object of the present invention is to provide improved methods for producing highly ordered arrays of 2 D crystals on a substrate which are fast, cost-efficient and simple to perform without the need of expensive equipment, for example in any standard chemical laboratory. A further object is to provide large and highly ordered arrays of 2 D crystals on a substrate, with the size and lattice constant of the domains being easily adjustable over a broad range.

Said objects are achieved according to the present invention by providing a novel method for producing highly ordered arrays of 2D crystals on a substrate according to claim 1 and by providing the highly ordered array of 2D crystals according to claim 13. Further aspects and preferred embodiments of the invention are the subject of additional claims.

DESCRIPTION OF THE INVENTION

The method according to the invention for producing a highly ordered array of 2D crystals on a substrate comprises the following steps:

a) providing a suspension of microspheres comprising poly-N-isopropylamide (polyNIPAM), the microspheres being selected from pure poly-N-isopropylamide (polyNIPAM) hydrogel microspheres, functionalized polyNIPAM microspheres, and polymeric or inorganic beads carrying poly-N-isopropyl-amide (polyNIPAM) hydrogel chains, in an aqueous medium on a substrate, wherein the aqueous medium comprises a mixture of water and a lower alkyl alcohol, b) subjecting the suspension deposited on the substrate after step a) to a shear force, and c) drying the suspension.

Surprisingly, it has been found by the present inventors that poly-N-isopropylamide (polyNIPAM) microspheres can be very effectively used in an improved method for producing arrays of colloidal 2D crystals having extraordinary long range order.

In this method, advantage is taken of several useful physical properties of polyNIPAM microspheres. Firstly, they undergo a reversible phase transition from a swollen to a shrunken state upon drying. This enables to prepare non-close packed colloidal crystals directly after sample drying without any further treatment. Another important property is the surface activity of polyNIPAM which can be induced by the addition of an alcohol to the suspension. It enables to use a shear force in order to further enhance the crystal order. The obtained long range order is outstanding with monocrystalline domains in the range of square millimeters.

The present inventors assume that the remarkable long range order obtained by the method of the invention is closely related to the self-healing properties of polyNIPAM, an interesting property of hydrogels which has been investigated recently (Iyer et al., *Angewandte Chemie International Edition* 48, 4562-4566 (2009)). It enables the lattice to tolerate inclusions without the introductions of dislocations—a property which cannot be observed for hard sphere colloids.

In an effort to develop an improved method for producing a highly ordered array of 2D crystals on a substrate, the present inventors conducted an extensive series of experiments, as a result of which several relevant parameters were identified and a number of especially advantageous and effective steps for use in such a method were developed.

The polyNiPAM microspheres which may be pure poly-N-isopropyl-amide (polyNIPAM) hydrogel microspheres, functionalized polyNIPAM microspheres, or polymeric or inorganic beads carrying poly-N-isopropylamide (polyNIPAM) hydrogel chains can be synthesized according to published methods (e.g. Pelton and Chibante, Colloids and Surfaces 1986, 20, 247-256). In this step, polyNIPAM hydrogel chains with varying length and hydrogel particles with different diameters and swelling ratios can be prepared and these parameters can be used to adjust the lattice constant and particle diameter of the periodic arrays formed subsequently. In the case of hydrogel chain carrying polymeric or inorganic beads, the beads may be of any material which can be functionalized with polyNIPAM chains. Some non-limiting examples are polystyrene, polymethyl-methacrylate, latex, $SiO_2$, $TiO_2$, $ZrO_2$, $CeO_2$ etc. The fact that polyNIPAM can be easily functionalized facilitates the creation of nanoscale 2D structures with novel interesting properties.

The particle size of the polyNIPAM microspheres may vary over a wide range from 20 nm to 2000 nm in diameter. In one specific embodiment, the microspheres have diameters in the range from 500-1500 nm, e.g. around 1100 nm as prepared in Example 1. However, the basic principles found here are applicable for smaller dimensions as well. As the feature size is controlled by the size of the used colloids and the smallest published polyNIPAM spheres published so far have a diameter of around 23 nm, the present method bears the potential to create sub 100 nm structures. This is a length scale where the most successful technique, photolithography, comes to its limits due physical limitations.

These polyNIPAM microspheres self-assemble into a two-dimensional superlattice when their dilute suspension is dried on substrate surfaces.

The substrate to be coated may be any substrate capable to be coated with the polyNIPAM microspheres. Some non-limiting examples are glass, silica, polystyrene, with glass especially preferred.

The aqueous medium used for the polyNIPAM suspension in step a) of the method according to the invention comprises water and a lower alkyl alcohol. Preferably, the lower alkyl alcohol is selected from the group consisting of methanol, ethanol and propanol. Most preferred, the alcohol is ethanol.

Typically, the ratio of water:alcohol in said medium is in the range from 8:1 to 1:2 by volume. Preferably, the ratio is from 4:1 to 2:3, more preferred 8:3 to 1:1, and especially preferred about 2:1.

When the volume of alcohol added was low (ratio >8:1) less particle adsorption at the liquid/air interface was observed, thus the obtained order was reduced. Very high alcohol contents (ratio <1:2) had a comparable effect. Best results were obtained when using a water:alcohol ratio of about 2:1.

The particle concentration of the microspheres in the aqueous suspension of step a) may be in the range from 0.7 to 0.15 g/L, usually in the range from 0.6 to 0.2 g/L, preferably from 0.5 to 0.25 g/L, more preferred from 0.4 g/L to 0.3 g/L.

If the particle concentration in the suspension is too low (below 0.15 g/L) the formed monolayer at the liquid/air interface won't be dense enough to support the formation of connected domains. Moreover the order enhancement is lower by the applied gas stream when the domains are loose.

If the particle concentration in the suspension is high (above 0.7 g/L) the particles aggregate at the liquid/air interface.

The deposition of the polyNIPAM suspension or dispersion onto the substrate in step a) can be effected in several ways. In one specific embodiment of the invention, a diluted aqueous PNIPAM dispersion is deposited onto the substrate and subsequently the alcohol is added in the desired proportion. In another specific embodiment, firstly a mixture of water and alcohol is deposited onto the substrate and then a concentrated polyNIPAM suspension is added.

In order to fabricate 2D non-close packed arrays with exceptional long-range order the amount of grain boundaries has to be decreased by merging smaller crystalline areas and the order of the array has to be preserved upon drying. If a droplet of a polyNIPAM microgel dispersion is just dried in air the resulting 2D crystal is rather polycrystalline and only moderately ordered—independent of the addition of ethanol.

Preferably, the shear force applied in step b) according to the method of the invention is generated by treating the suspension with a linear or oscillating/pulsed gas stream. Generally, better results are achieved with an oscillating or pulsed gas stream.

In principle there are two ways of applying a gas stream. In one set-up the sample is stationary and the gas stream is applied by an external source such as a gas ejecting device, e.g. a gas pistol.

In another set-up no external source is used but the sample is moved with respect to the surrounding medium. The sample movement also induces a gas stream directed to the sample surface.

In the set-up using an external source, both the gas pressure and the width of the gas stream are critical parameters. If the gas stream is too punctual and/or the pressure is too high, destruction of the crystal domains is observed, i.e. the long range order is decreased rather than increased.

Typically, the gas pressure will be in the range from 1-3 bar, more specifically in the range of from 1.1 to 2 bar, and the nozzle diameter of the gas source will be in the range of a few mm, such as 1-10 mm, more specifically 2-8 mm, in particular 3-6 mm, preferably 3-4 mm.

For a nozzle diameter of 3-4 mm, a gas pressure of around 1.5 bar, such as 1.4-1.6 bar, showed best results with respect to order enhancement, whereas a gas pressure of >2 bar resulted in an impairment of the crystal domains. For a nozzle diameter <3 mm, already a gas pressure >1.5 bar resulted in an impairment of the crystal domains.

In the set-up using no external source any device can be used that causes a movement of the sample such as spincoater, shaker, rotator and so on. Among these devices, best results were obtained when using a spincoater at a rotation speed of 400-600 rpm, preferably around 500 rpm, and a rotation time of about 5 min. Higher rotation speeds may lead to the destruction of the crystal domains. Lower rotation speeds induce a gas stream that is presumably too low to induce an order enhancement.

The gas stream can be applied linearly or oscillatory. The oscillation of the gas stream can be induced in a spin coating system by applying an oscillating rotation speed. In a spin-coating system the rotation speed typically may be varied between a high speed of 400-600 rpm, preferably 450-550 rpm, in particular about 500 rpm, and a low speed of 30-300 rpm, preferably 30-100 rpm, in particular about 50 rpm, with interval times of 5-20 s (high speed) and 2-10 s (low speed), respectively. Best results were obtained with a high speed of about 500 rpm, a low speed of about 50 rpm and an interval time of about 10 s and 5 s, respectively.

If an external gas source is used, the gas stream has to be pulsed. In a typical embodiment of the invention, the pulsed gas stream comprises a series of individual pulses having a duration in the range from 0.5-10 s, preferably 1-5 s, interrupted by breaks having a duration in the range from 0.5-10 s, preferably 1-5 s, for a total time in the range from 30 to 120 s.

The gas stream may comprise or consist of air or an inert gas, such as nitrogen or a noble gas, e.g. argon etc.

In a preferred embodiment of the invention, the gas stream further comprises water vapor. Typically, the proportion of the water vapor in the gas stream is at least 5%, preferably 10-30%, more preferred 10-20%, such as 14-16%. It was observed that a gas mixture containing about 85% $N_2$ and 15% water vapor showed best results.

The gas stream induces solvent evaporation. Apparently it is disadvantageous for the particle ordering if the solvent evaporation is too fast. Thus, using a gas containing no water vapor leads to less order enhancement. This also holds true when applying a gas stream by an external source or when the sample is moved.

Best results were observed when the pulsed gas stream treatment is combined with a subsequent spincoating step c) for drying. In this case the spincoating is not necessary to improve the crystal order but prevents the formation of multilayers of particles which occurs when the particle density in the suspension is high. Consequently, this spinning operation need not be effected in an oscillatory manner and the rotation speed may be higher than 500 or 600 rpm. Typically this spin-drying is effected in two steps, a first step at relatively low speed such as 400-600 rpm for several minutes, e.g. 5-10 minutes, and a second step at high rotation speed of more than 1000 rpm, e.g. 6000 rpm as used in Example 1, for 30 s to 300 s, preferably 30 s to 120 s.

A closely related aspect of the present invention are the highly ordered arrays of 2D crystals obtainable with the above method. Typically, they have a long-range order with a standard deviation of the lattice constant of no more than 3 to 4%. These highly ordered arrays are also considerably larger than those produced with prior art methods nanolithography and comprise extended monocrystalline domains in the range of square millimeters. The monocrystalline domains obtainable with the method of the invention have an area of at least 0.1 mm$^2$, preferably at least 1 mm$^2$, at least 5 mm$^2$ or at least 10 mm$^2$. Very large monocrystalline domains having an area of around 10 mm$^2$ actually were obtained by the present inventors.

The highly ordered arrays of 2D crystals according to the invention are of interest for a wide variety of applications, in particular in the fields of chemical and biochemical sensing, optics, photonics, and spectroscopy, as well as lithographic techniques. Non-close packed colloidal crystals are of particular interest as templates for structures such as subwavelength hole arrays, super hydrophobic surfaces or diffractive optical elements.

Thus, a further aspect of the invention relates to a device, in particular an optic device, photonic device, spectroscopic device or sensor device, or lithographic mask, comprising said highly ordered arrays.

Closely related aspects of the present invention relate to the use of the method according to any one of claims 1-12 for preparing a mask for the fabrication of nanohole arrays as well as to a method for the fabrication of nanohole arrays using a highly ordered array of 2D colloidal crystals as lithographic mask, wherein said lithographic mask is prepared by the method according to any one of claims 1-12.

BRIEF DESCRIPTION OF THE FIGURES

FIG. 1. Formation of ordered polyNIPAM microgel arrays by addition of alcohol to the aqueous dispersion medium FIG. 2. Optical brightfield phase contrast microscopy image of a highly ordered polNIPAM microsphere monolayer assembled at an air/liquid surface FIG. 3. SEM images of polyNIPAm arrays prepared by different methods. (a) air-drying; (b) spin-coating; (c) treatment with a pulsed gas stream+spin-coating FIG. 4. Radial distribution function of the highly ordered array of FIG. 3(c); Bars indicate the expected peak positions of an ideal hexagonal lattice.

The present invention is illustrated in more detail in the following non-limiting examples.

EXAMPLE 1

Preparation of a Long Range Ordered 2D Crystal Array of polyNIPAM Microspheres

In a specific embodiment of the present invention, 2D crystal arrays on a glass substrate were produced.
PolyNIPAM Microgel Synthesis:

Hydrogel microspheres composed of N-isopropylacrylamide (NIPAM, recrystallized from n-hexane) and N,N'-methylene bisacrylamide (BIS) were prepared by an aqueous free-radical precipitation polymerization according to Pelton et al., *Colloids Surfaces* 1986, 20, 247-256.

Briefly, 0.19 mol/L NiPAM and 0.05 mol/L BIS were dissolved in 124 mL deionized water (~18.2 MΩcm) using a 250 mL three-neck flask. The solution was heated to ~70° C. under argon atmosphere and stirred with a magnetic stir bar. The polymerization was started by injection of a potassium peroxodisulfate (KPS) solution (0.002 mol/L) and carried out for 6 hours at ~70° C. under an Ar environment. The polyNIPAM microgel was purified by centrifugation, decantation, and redispersion in deionized water (three times) and finally by filtration (Acrodisc 25 mm syringe filters with Versapor membranes, pore diameter: 1.2 μm).

The diameter of the swollen poly(NIPAM) microgels is 1092±35 nm estimated by scanning electron microscopy (SEM). For this purpose, several SEM images with a total number of roughly 175000 microspheres were analyzed and the lattice constants determined using the image analysis tool of ImageJ 1.37v. This size determination method is based on the assumption that the center-to-center distance of the ordered polyNIPAM discs is correlated to the diameter of the swollen polyNIPAM microspheres. The concentration of the polyNIPAM dispersion used in this study was determined by gravimetry. An average over three measurements yields a concentration of 19.6±0.4 g/L. After filtration the polyNIPAM dispersion was diluted 1:50 (v:v) with deionized water.
Self-Assembly:

PolyNIPAM microgel assembly was investigated on glass coverslips (2×2 cm, obtained from Carl Roth, Germany) which were cleaned with a 3:1 mixture of $H_2SO_4$ (95-98%) and $H_2O_2$ (30%) for 1.5 h followed by extensive rinsing with deionized water (~18.2 MΩcm). Prior to spin-coating, the cleaned glass coverslips were stored in deionized water for 1-24 h and were blown dry with $N_2$.

40 μL $H_2O$ was placed on a cleaned glass cover slip and mixed with 20 μL EtOH. Then 2.5 μL of concentrated polyNIPAM microsphere dispersion (19.6±0.4 mg/ml) was added. Right after adding the dispersion a pressure-modulated gas stream was directed to the sample surface using a nitrogen gun. Afterwards the substrate was dried by spin-coating. Spin-coating was carried out with a Laurell WS-400A-6NPP Lite spin coater and the spinning program consisted of 6 min at 500 rpm followed by 1 min at 6000 rpm using an acceleration of 100 rpm/s in both cases.

In an alternative approach 40 μL of a 1:50 diluted dispersion was placed on a cleaned glass cover slip. After addition of 20 μL EtOH the dispersion droplet divided into smaller droplets which coalesced after several seconds forming a thin liquid film on top of the glass cover slip. Subsequently a gas stream and spin coating was applied as described above.

The two approaches differ in the manner that the gas stream is applied during microsphere assembly in the first case or after microsphere assembly has already taken place in the latter case. Slightly better results were obtained with the first approach.

EXAMPLE 2

Characterization of the 2D Crystal Arrays

Figure 1:
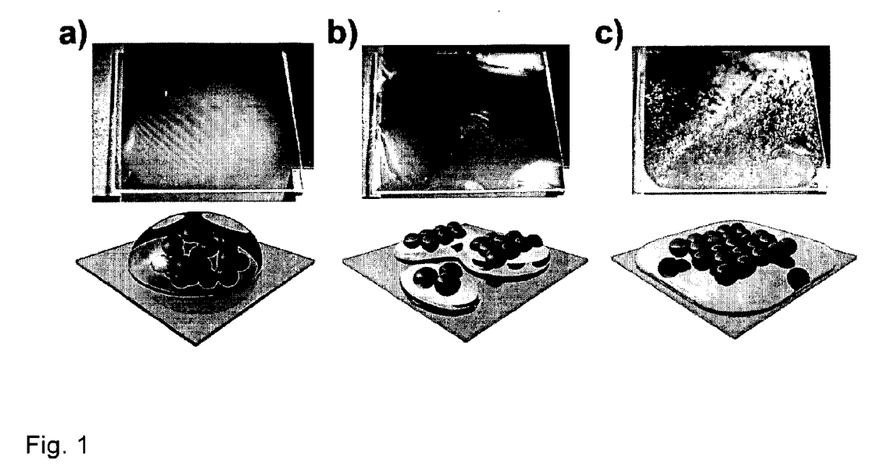

FIG. 1 illustrates the formation of ordered polyNIPAM microgel arrays by addition of alcohol to the dispersion medium (water). Upper row: photographs of a polyNIPAM microgel dispersion prepared according to Example 1 on top of glass slides illuminated by a white light source. Bottom row: schematics of array formation. a) PolyNIPAM spheres are randomly distributed in the dispersion medium (water) before ethanol addition resulting in a turbid droplet. b) Addition of ethanol leads to the division of the polyNIPAM microgel droplet into smaller droplets due to surface tension gradients. Small regions of ordered polyNIPAM 2D arrays are formed at the air/liquid interface leading to the local appearance of brilliant spectral colors by diffraction of light. c) A thin liquid film on top of the glass cover slip is formed by coalescence of the smaller droplets. At the air/liquid interface a monolayer of highly ordered polyNIPAM microspheres is indicated by the brilliant color of the entire film.

Figure 2:
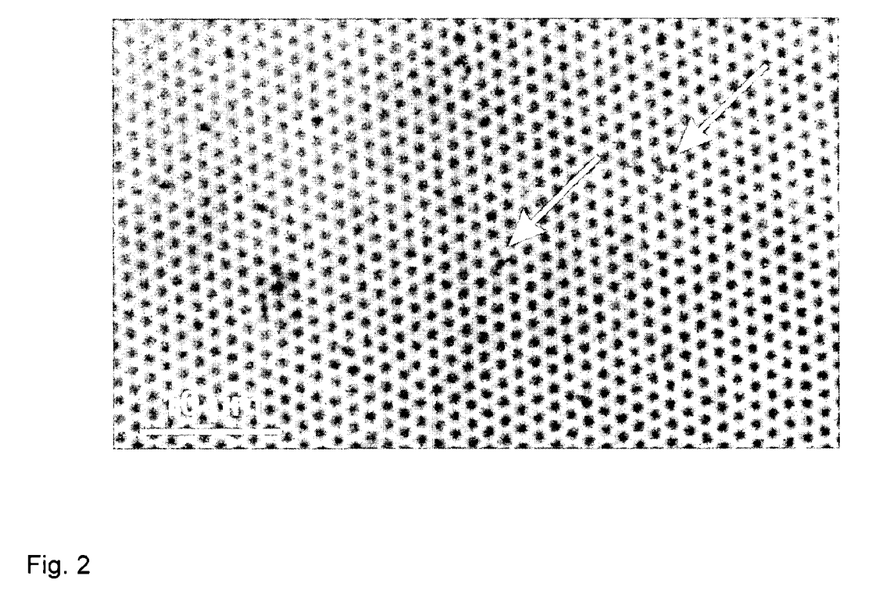

Optical microscopy images (phase contrast) confirm the presence of a highly ordered monolayer at the air/liquid interface (FIG. 2). When rendering the focus through the droplet domains of 2D highly ordered arrays of polyNIPAM spheres can be observed which are exclusively located at the air/liquid interface. The assembly of polyNIPAM microspheres is based on the non-cosolvency of polyNIPAM in binary mixtures of water and alcohol. Both water and alcohol alone are good solvents for polyNIPAM whereas mixtures show substantially decreased solubility at certain mixing ratios. Thus, when ethanol is added, the liquid becomes a poor solvent for polyNIPAM. As a result it is more favorable for the microspheres to adsorb at the air/liquid interface.

At this stage the present method could be compared with the Langmuir Blodgett technique which is used to prepare close packed 2D colloidal crystals (Reculusa, S., et al., *Physical Chemistry Chemical Physics* 2007, 9 (48), 6385-6390). However, the Langmuir Blodgett approach requires special equipment (Langmuir-Blodgett trough), surface-active polymer spheres and a spreading agent which has to be removed after crystal preparation. In addition, only close packed arrays are accessible by using this technique. The superiority of the present method is also reflected in the tolerance towards inclusions which can already be observed in the polyNIPAM microgel array formed at the air/liquid interface (FIG. 2, arrow). The "soft" polyNIPAM microspheres are able to dissipate defect energies over long distances through the lattice demonstrating their exceptional self-healing properties.

In order to fabricate 2D non-close packed arrays with exceptional long-range order the amount of grain boundaries has to be decreased by merging smaller crystalline areas and the order of the array has to be preserved upon drying. If a droplet of a polyNIPAM microgel dispersion is just dried in air the resulting 2D crystal is rather polycrystalline and only moderately ordered—independent of the addition of ethanol.

Figure 3:
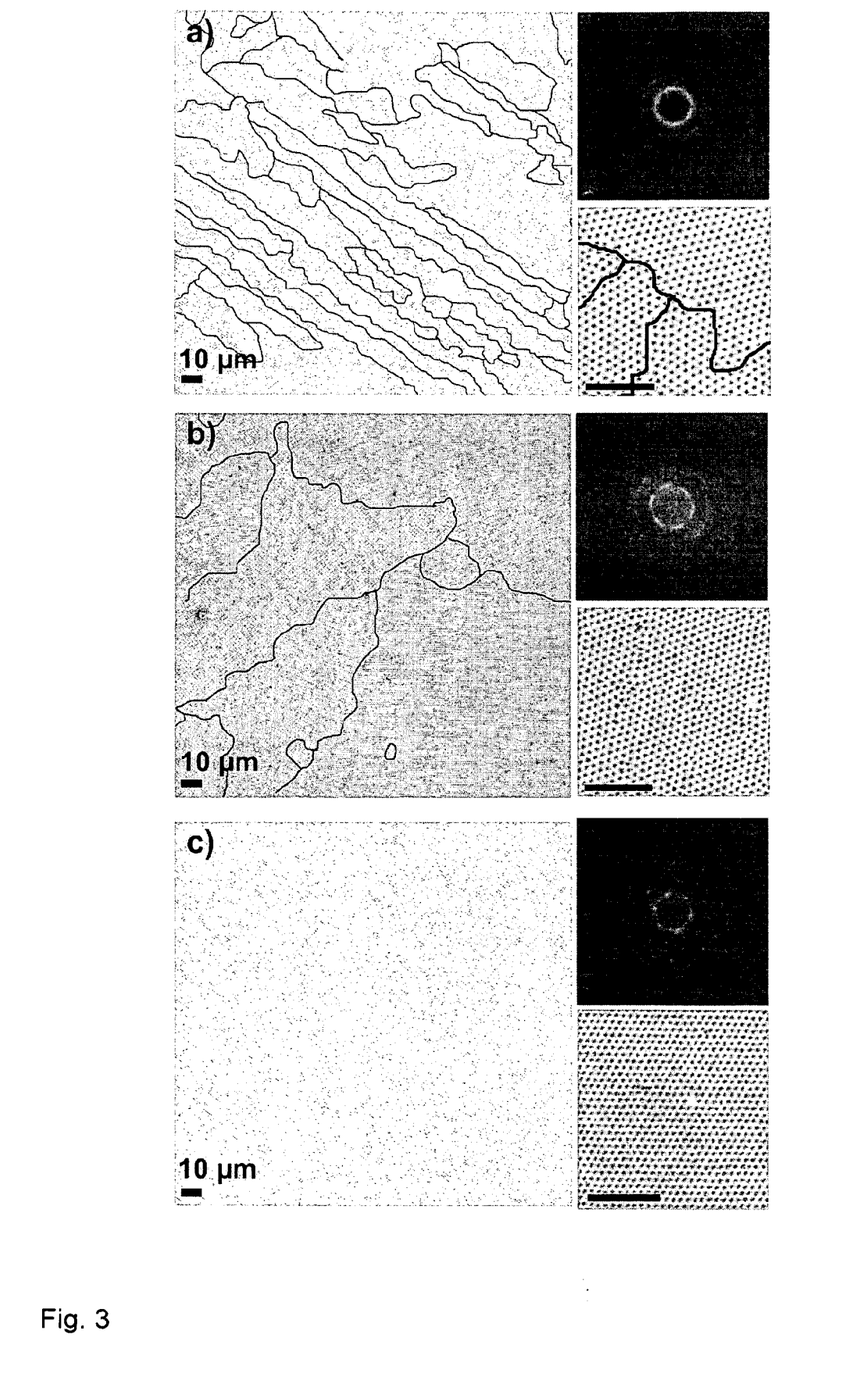

In FIG. 3 a) scanning electron microscopy (SEM) images of an as-prepared non-close packed 2D array of polyNIPAM microspheres are displayed. Grain boundaries are indicated by black lines and reflected in the 2D Fourier transform where no defined lattice vectors can be seen, demonstrating the poor long range order of the array. The crystalline domain size is considerably increased by applying shear which can be either induced by using a spin coating system at low speed or any other suitable external source. FIG. 3 b) shows SEM images of a polyNIPAM microsphere array which has been prepared by a two step process consisting of the generation of an ordered monolayer of polyNIPAM spheres at the air/liquid (water/alcohol) interface and spin-coating. Here, the substrate was first spun at low speed for several minutes in order to generate a highly ordered array by shear force. After removal of the liquid using spin-coating at higher speed, a 2D non-close packed array with a considerably decreased number of grain boundaries in comparison to polyNIPAM microsphere arrays prepared by air-drying was obtained. The corresponding 2D Fourier transform verifies the improved long-range order of the array.

Further elimination of grain boundaries was achieved by treating the monolayer of polyNIPAM spheres at the air/liquid interface with an oscillatory air stream prior to spin coating. The applied shear force led to fusion of the crystalline areas. Spin coating was additionally used in order to prevent the formation of density stripes in the crystal which are generated by non-constant velocity of the receding droplet. In FIG. 3 c) SEM images of the resulting 2D non-close packed array of polyNIPAM microgels with extraordinary order are displayed. No grain boundaries are observed within the scanned field of 0.06 mm². Consequently, the corresponding 2D Fourier transform of the low magnification SEM image shown in FIG. 3 c) displays the expected pattern composed of distinguished points indicating the exceptional order of the lattice (area of more than 10000 μm²). At higher magnification point defects can be noticed which do not influence the crystallinity of the 2D lattice. Insets in FIG. 3 are presented in order to provide a better visibility of the microspheres (scale bars: 10 μm).

In order to quantify the lattice order, the pair distribution function g(r) was calculated. The particle positions were located using the particle analysis function of ImageJ.

Figure 4:
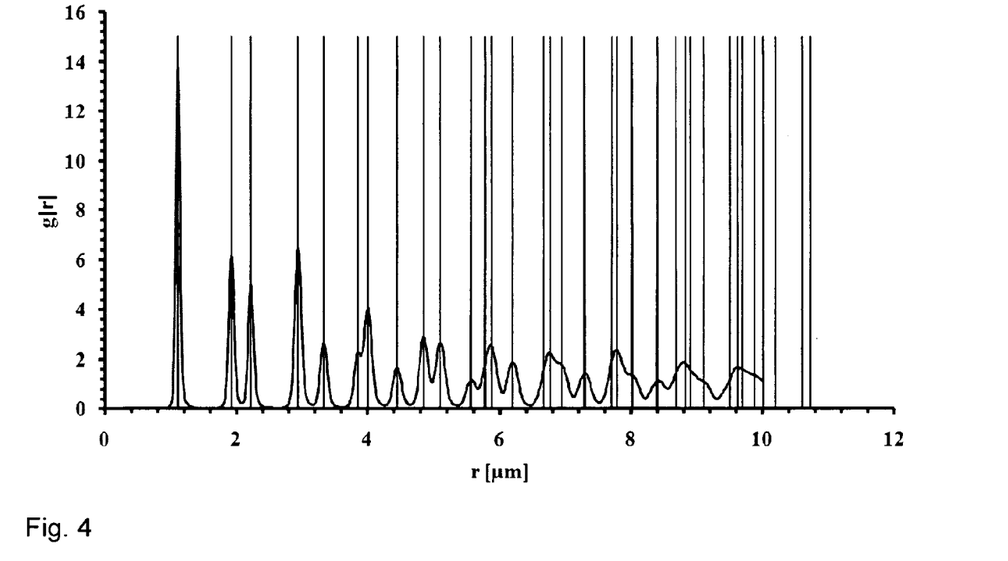

The function g(r) was computed as follows:

$$g(r) = N(r)/2\pi r \Delta r \rho,$$

where $N(r)$ is the number of particles in an annular disc of radii $r$ and $r + \Delta r$ drawn with a particle at the centre, $\rho$ the number of particles per cm². g(r) was averaged over about 35000 particles (the size of the used rectangular SEM image was 0.24 mm×0.16 mm). The function is displayed in FIG. 4 for the first 10 μm. Also shown are the expected peak positions for a perfect hexagonal lattice. The peak positions of the array coincide with the predicted peak positions. Moreover the individual peaks are quite well resolved. The first peak was least square fitted with a Gaussian function to determine the standard deviation of the lattice constant (dL). From this a lattice constant (L) of 1092±35 nm was calculated, which means that on average the particle to particle distance deviates only by roughly 3%.

These results allow the conclusion that shear stress can be utilized for the fabrication of 2D non-close packed arrays of soft polyNIPAM microspheres with exceptional long-range order. Improvement of crystal structures prepared from hard spheres using constant or vibrational shear has already been reported by several authors. For example, Wei and Wu investigated the assembly of polystyrene beads embedded in a soap film which was subjected to mechanical vibrations (Wei, H., and Wu, X. L., *Physical Review E* 2004, 70 (2)). The induced stress field led to a decrease in grain boundary length and number. These authors coined the term of mechanical annealing to describe the process which draws an analogy to the field of metallurgy. There, thermal annealing is a well-known technique to generate single crystals. In this case, the applied heat provides the energy needed to relieve internal stress and to remove crystal defects.

Even if mechanical annealing allows for the reduction of grain boundaries, point defects primarily inclusions are still present after this treatment. Hence, application of shear force alone is not sufficient in order to fabricate 2D arrays possessing the exceptional long-range order of colloidal crystals prepared by the present method.

Figure 5:
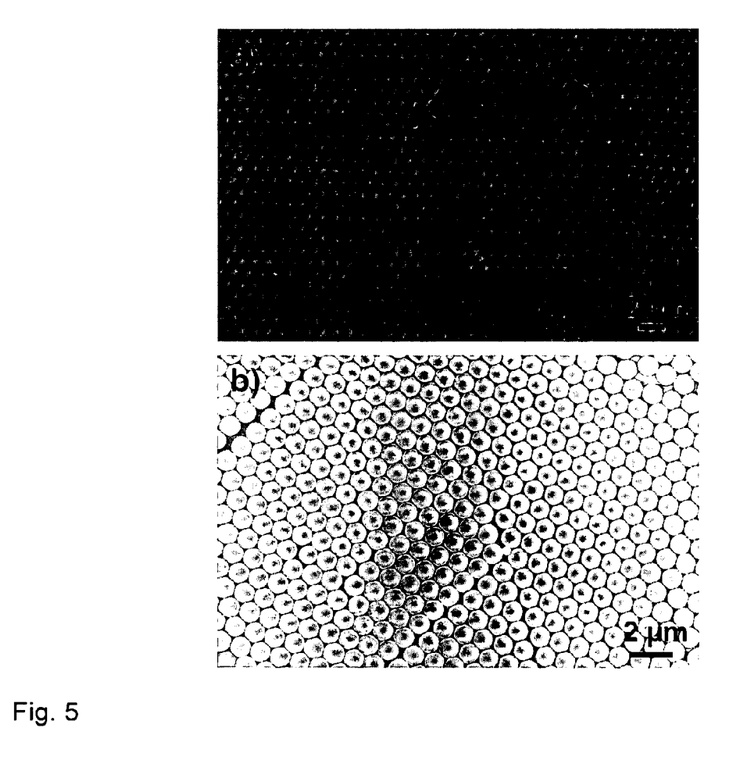
FIG. 5. SEM micrographs of colloidal arrays prepared from (a) soft (polyNIPAM) and (b) hard (polystyrene) microspheres FIG. 6. SEM pictures of sub-wavelength hole arrays.

FIG. 5 shows SEM images of 2D arrays composed of either hard spheres (polystyrene spheres, FIG. 5b)) or soft hydrogel particles (polyNIPAM spheres, FIG. 5a)). An inclusion in a hard sphere lattice leads to the formation of a local and a long range lattice distortion. In contrast, the 2D microgel colloidal crystals from polyNIPAM spheres can tolerate point defects and the lattice perturbation is exclusively restricted to the next neighbors. This tolerance is based on the soft and compressible nature of the employed hydrogel microspheres which allows for dissipation of the defect energy over long range distances through the lattice. Hence, microgels possess in general self-healing properties which we have exploited for the fabrication of 2D non-close packed arrays with exceptional order.

EXAMPLE 3

Figure 6A:
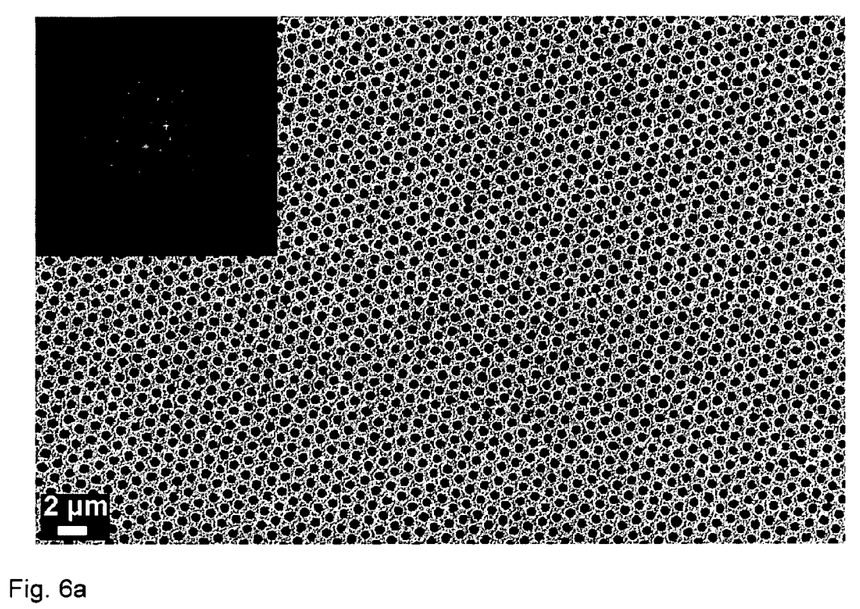
FIG. 6a shows a hole array fabricated using 2D crystals where air shear was applied to improve the order.
Figure 6B:
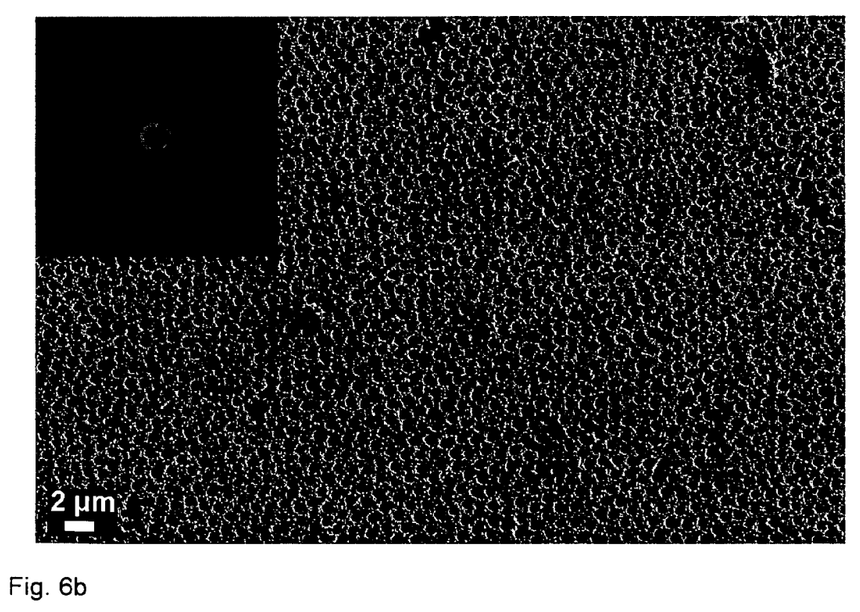
FIG. 6b shows a hole array fabricated using 2D crystals prepared by simple air drying.

Use of 2D Crystal Arrays as a Mask for the Fabrication of Subwavelength Hole Arrays In order to demonstrate the technical relevance of a very high long range order of 2D colloidal crystals, different polyNIPAM arrays were used as a mask for the fabrication of sub-wavelength hole arrays as described in WO 2010/099805 A1. In one case the 2D crystals were prepared using the common approach of simple air drying (FIG. 6b). In a second approach the 2D crystals prepared by the novel technique to obtain an enhanced order were used (FIG. 6a).

Figure 7:
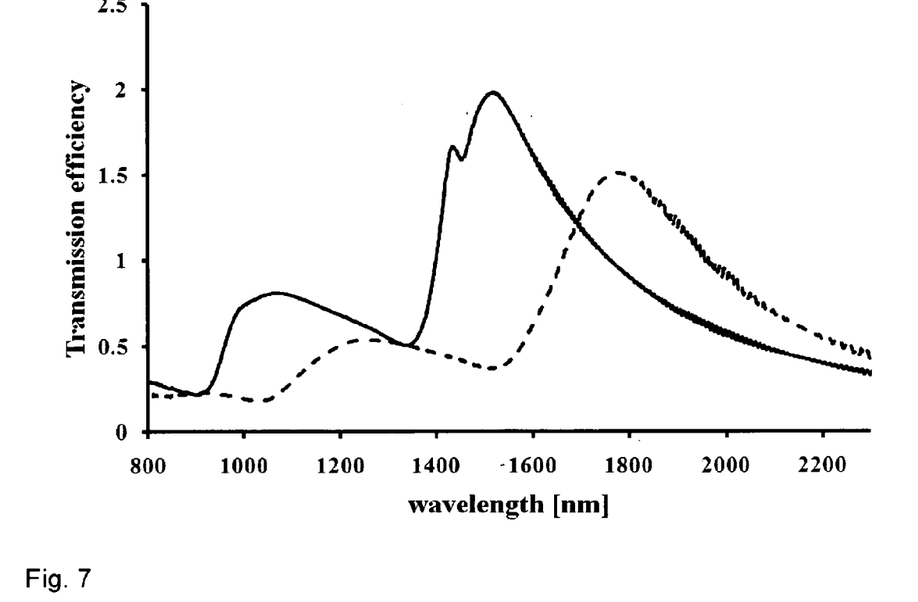
FIG. 7. Transmission spectra of sub-wavelength hole arrays in gold films. The dashed line shows the transmission of a hole array using 2D crystals prepared by simple air drying. The solid line shows the transmission of a hole array using 2D crystals prepared by the present method using an oscillatory air shear.

Subsequently, the transmission spectra of these structures were measured and the data are shown in FIG. 7. The dashed line shows the transmission of a hole array using 2D crystals prepared by simple air drying. The solid line shows the transmission of a hole array using 2D crystals prepared by our method using an oscillatory air shear. As it can be seen the resonances become narrower due to the enhanced order. The longer wavelength resonance reveals also its fine structure indicating the high order of the array. Finally the transmission efficiency of the hole array is improved by 25% for the highly ordered case. These findings show that the spectral quality of the sub-wavelength hole arrays can be greatly improved when applying the present technique to enhance the lattice order of the mask.

Figure 8A:
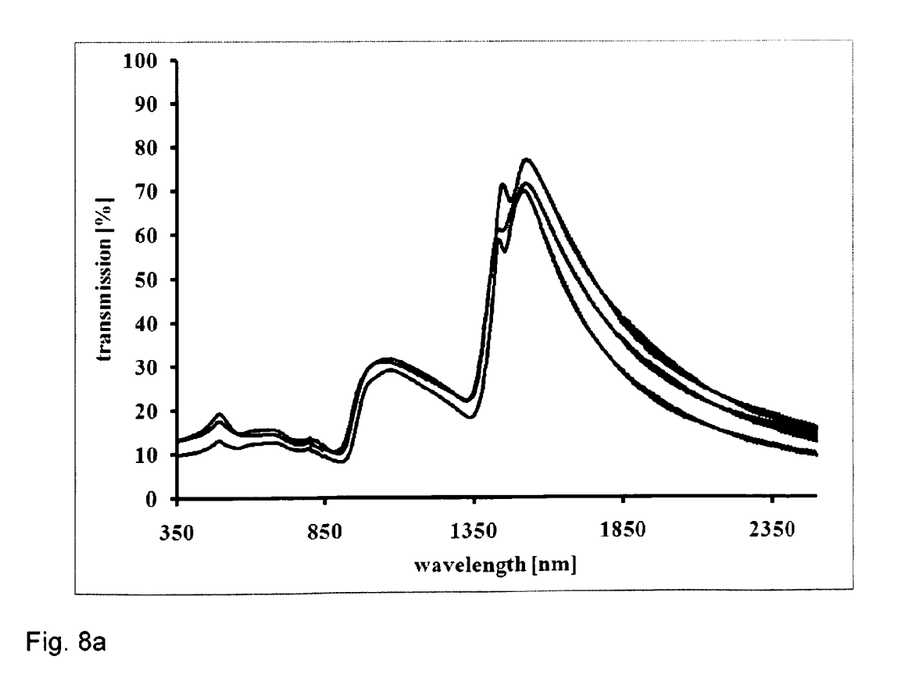
FIG. 8. Reproducibility of transmission spectra of a sample with enhanced order (FIG. 8a) and order obtained by simple air drying (FIG. 8b). The transmission spectra were measured at three random positions for each sample.
Figure 8B:
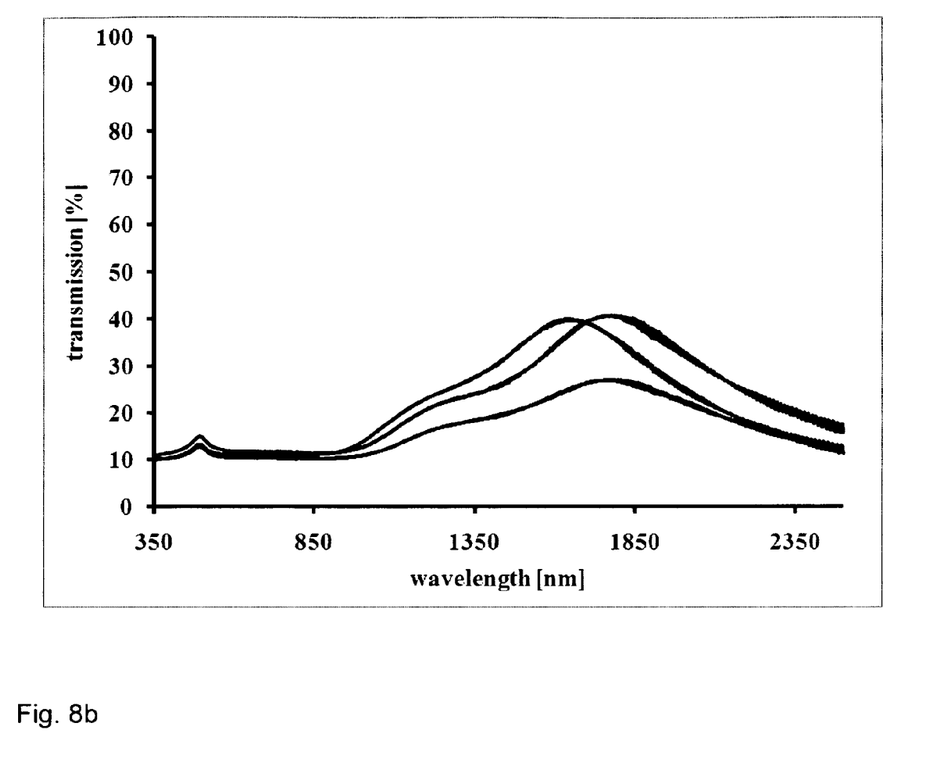

Another important issue is the spectral reproducibility of the structures. In order to investigate this, the transmission spectra of a sample with enhanced order and of a sample with poor order were measured at three random positions. FIG. 8 shows the results. The sample prepared using simple air drying shows a high variation in peak position and absolute transmission (FIG. 8b). The sample with enhanced order in contrast shows a much higher conformity of the spectra (FIG. 8a). Peak position and peak height agree quite well within the different sample positions. The remaining differences are most likely due to variations in gold film height. However, the figure shows clearly the great impact of order enhancement (strong increase) on the spectral reproducibility.

Summarizing, this work presents a simple approach for the fabrication of 2D non-close packed arrays with exceptional long range order which results from the self-healing properties of the employed hydrogel spheres. The method is based on the altered solubility of poly(N-isopropyl-acrylamide) (polyNIPAM) microgels in alcohol/water mixtures leading to the formation of a microsphere monolayer at the air/liquid interface whose long-range order can significantly be improved by applying shear. After removal of the dispersion medium (water/alcohol) a highly ordered non-close packed 2D array with single crystalline domains in the range of square millimeters is obtained demonstrating the tolerance of the polyNIPAM arrays towards inclusions leading to a suppression of dislocations.

The invention claimed is:

1. A method for producing an ordered array of non-close packed colloidal 2D crystals on a substrate, comprising the steps:
   a) providing a suspension of microspheres comprising poly-N-isopropylamide (polyNIPAM), the microspheres being selected from pure poly-N-isopropylamide (polyNIPAM) hydrogel microspheres, functionalized polyNIPAM micro-spheres, and polymeric or inorganic beads carrying poly-N-isopropyl-amide (polyNIPAM) hydrogel chains, in an aqueous medium on a substrate, wherein the aqueous medium comprises a mixture of water and an alcohol,
   b) subjecting the suspension deposited on the substrate after step a) to a shear force generated by treating the suspension with a linear or pulsed gas stream, and
   c) drying the suspension.

2. The method according to claim 1, wherein the pulsed gas stream is generated by a gas ejecting device and directed to a non-moving substrate.

3. The method according to claim 2, wherein the pulsed gas stream comprises a series of individual pulses having a duration in a range from 0.5-10 s, interrupted by breaks having a duration in a range from 0.5-10 s for a total time in a range from 30 to 120 s.

4. The method according to claim 2, wherein the pulsed gas stream comprises a series of individual pulses having a duration in a range from 1-5 s, interrupted by breaks having a duration in a range from 1-5 s for a total time in a range from 30 to 120 s.

5. The method according to claim 1, wherein the gas stream comprises air or an inert gas.

6. The method according to claim 5, wherein the gas stream further comprises water vapor.

7. The method according to claim 1, wherein the shear force is generated by moving the substrate surface in a gas.

8. The method according to claim 7, wherein the moving of the substrate surface involves a spinning step.

9. The method according to claim 1, wherein step c) comprises a spinning step.

10. The method according to claim 1, wherein the alcohol is selected from the group consisting of methanol, ethanol and propanol.

11. The method according to claim 1, wherein the particle concentration of the microspheres in the aqueous suspension is in a range from 0.7 to 0.15 g/L.

12. The method of claim 1, wherein the ordered array of non-close packed colloidal 2D crystals on a substrate is a mask for fabrication of nanohole arrays.

13. A method for fabricating nanohole arrays using an ordered array of 2D colloidal crystals as a lithographic mask, wherein said lithographic mask is prepared by the method according to claim 12.

14. The method according to claim 1, wherein the particle concentration of the microspheres in the aqueous suspension is in a range from 0.4 to 0.3 g/L.

15. A method for producing an ordered array of non-close packed colloidal 2D crystals on a substrate, comprising the steps:
   a) providing a suspension of microspheres comprising poly-N-isopropylamide (polyNIPAM), the microspheres being selected from pure poly-N-isopropylamide (polyNIPAM) hydrogel microspheres, functionalized polyNIPAM micro-spheres, and polymeric or inorganic beads carrying poly-N-isopropyl-amide (polyNIPAM) hydrogel chains, in an aqueous medium on a substrate, wherein the aqueous medium comprises a mixture of water and an alcohol,
   b) subjecting the suspension deposited on the substrate after step a) to a shear force, wherein the shear force is generated by spinning the substrate in a gas with an oscillating rotation speed varied from a high speed of 450-550 rpm to a low speed of 30-100 rpm, and
   c) drying the suspension.

* * * * *